United States Patent [19]

Vora et al.

[11] 4,418,468

[45] Dec. 6, 1983

[54] PROCESS FOR FABRICATING A LOGIC STRUCTURE UTILIZING POLYCRYSTALLINE SILICON SCHOTTKY DIODES

[75] Inventors: Madhukar B. Vora, Los Gatos; Hermaj K. Hingarh, San Jose, both of Calif.

[73] Assignee: Fairchild Camera & Instrument Corporation, Mountain View, Calif.

[21] Appl. No.: 261,842

[22] Filed: May 8, 1981

[51] Int. Cl.[3] ................. H01L 21/20; H01L 21/76
[52] U.S. Cl. ......................... 29/577 C; 29/576 E; 29/576 W; 29/578; 29/591; 148/174; 148/175; 148/187; 148/188; 357/15; 357/51; 357/59; 357/67; 357/71; 357/92; 427/84; 427/89
[58] Field of Search ............ 29/576 E, 576 W, 577 C, 29/578, 591; 148/174, 175, 187, 188; 427/84, 89; 357/15, 46, 50, 51, 59, 67 S, 86, 92, 71 S

[56] References Cited

U.S. PATENT DOCUMENTS

| | | | |
|---|---|---|---|
| 3,486,029 | 12/1969 | Barrett et al. | 357/59 X |
| 3,648,125 | 3/1972 | Peltzer | 357/50 |
| 4,127,931 | 12/1978 | Shiba | 29/578 X |
| 4,169,746 | 10/1979 | Ipri et al. | 148/175 |
| 4,190,949 | 3/1980 | Ikeda et al. | 148/175 X |

FOREIGN PATENT DOCUMENTS 54-107279 8/1979 Japan ........................ 357/59 R

OTHER PUBLICATIONS

Isaac et al., "Method for Fabricating a Self-Aligned Vertical PNP Transistor", I.B.M. Tech. Discl. Bull., vol. 22, No. 8A, Jan. 1980, pp. 3393-3396.
Berger et al., "Cross–Coupled–Transistor with Stacked Interconnection Lines", I.B.M. Tech. Discl. Bull., vol. 21, No. 12, May 1979, p. 4886.
Roesner et al., "New High Speed I$^2$L Structure", IEEE J. Solid-State Circuits, vol. SC-12, No. 2, Apr. 1977, pp. 114-118.
Okada et al., "New Polysilicon Process-Bipolar Device-PSA Technology", IEEE J. Solid-State Circuits, vol. SC-14, No. 2, Apr. 1979, pp. 307-311.

*Primary Examiner*—W. G. Saba
*Attorney, Agent, or Firm*—Kenneth Olsen; Michael J. Pollock; Carl L. Silverman

[57] ABSTRACT

An integrated circuit structure and process for fabricating it are described which allow fabrication of a very compact high-speed logic gate. The structure utilizes a bipolar transistor formed in an epitaxial silicon pocket surrounded by silicon dioxide. A pair of Schottky diodes and a resistor are formed outside the epitaxial pocket on the silicon dioxide and connected to the pocket by doped polycrystalline silicon.

9 Claims, 8 Drawing Figures

PROCESS FOR FABRICATING A LOGIC STRUCTURE UTILIZING POLYCRYSTALLINE SILICON SCHOTTKY DIODES

BACKGROUND OF THE INVENTION

1. Field of the Invention

This invention relates to integrated circuit structures and methods of manufacturing them, and in particular, to an integrated circuit structure in which one or more transistors are formed in a region of semiconductor material electrically isolated from surrounding regions by a region of dielectric material and one or more Schottky diodes are formed on the surface of the dielectric material.

2. Description of the Prior Art

Logic gate integrated circuit structures in which an input signal is applied to the base of a bipolar transistor having an interconnection between the base and an emitter, and in which one or more Schottky diodes are connected to the collector of the bipolar transistor are known. See, for example, "A New High Speed I²L Structure" by B. Roesner et al., IEEE Journal of Solid State Circuits, April 1977 pages 114–118. Also well known are self-aligned bipolar transistor structures.

SUMMARY OF THE INVENTION

This invention provides an integrated circuit structure and a process for manufacturing it which permits the fabrication of unusually compact high-speed logic circuits. In particular, the invention provides an integrated circuit structure including a bipolar transistor fabricated in a region of semiconductor material electrically isolated from surrounding regions by a region of dielectric material, and at least one Schottky diode and a resistor formed on the dielectric material outside the region of semiconductor material and connected to the bipolar transistor. The resulting integrated circuit structure provides a logic gate in which parasitic capacitance and diode resistance are substantially reduced to permit very high speed switching of the structure.

In one embodiment a method for fabricating the structure includes the steps of forming a pocket of semiconductor material surrounded by insulating material; depositing a layer of a metal silicide on a first region of the insulating material; depositing a first layer of semiconductor material on the layer of metal silicide; and forming selected portions of a second layer of semiconductor material over at least a second region of the insulating material, the first layer of semiconductor material, and selected portions of the pocket, at least those portions of the second layer extending from the first layer to the pocket and from the pocket to the second region having higher impurity doping than that portion of the second layer overlying the second region. The process of the invention requires a minimal number of masking steps and results in an extremely compact structure to enable very high packing densities.

BRIEF DESCRIPTION OF THE DRAWINGS

FIG. 1 is a cross-sectional view of an integrated circuit structure after fabrication of an electrically isolated pocket of semiconductor material surrounded by insulating material.

FIG. 2 is a subsequent cross-sectional view after formation of a layer of metal silicide and two layers of selectively doped polycrystalline silicon.

FIG. 3 is a subsequent cross-sectional view after formation of a layer of insulating material on the polycrystalline silicon and definition of the polycrystalline silicon.

FIG. 4 is a subsequent cross-sectional view after formation of further insulating material and the transistor emitters.

FIG. 5 is a final cross-sectional view after formation of electrical contacts to the structure.

FIG. 6 is a top view of the structure shown in FIG. 5 illustrating the compact arrangement of the structure.

DESCRIPTION OF THE PREFERRED EMBODIMENTS

The integrated circuit structure of this invention provides a logic circuit containing a bipolar transistor, a high value resistor, and one or more Schottky barrier diodes. Because the resistor and diodes are formed outside the monocrystalline silicon in which the bipolar transistor is fabricated, parasitic capacitances are substantially reduced.

Figure 1:
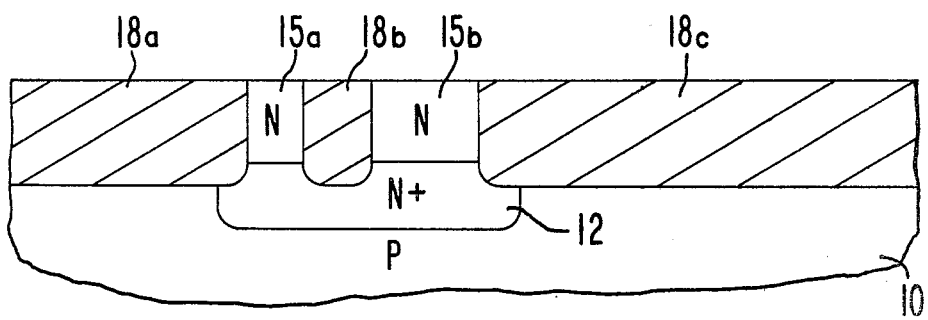
FIGS. 1 through 6 illustrate one process for fabricating the structure of this invention.

The preferred embodiment of a process for fabricating the invention is shown in FIGS. 1 through 5. FIG. 1 illustrates a structure readily achievable using integrated circuit processing technology of the prior art. In particular, in FIG. 1 a P conductivity substrate 10 has formed therein a strongly doped N conductivity type buried layer 12. A layer of N doped epitaxial silicon 15 is then deposited across the surface of substrate 10 and regions of silicon dioxide 18 are formed. One technique for fabricating the structure depicted in FIG. 1 is taught by Douglas Peltzer in U.S. Pat. No. 3,648,125 entitled: "Method of Fabricating Integrated Circuits with Oxidized Isolation and the Resulting Structure." As will be evident, however, the invention herein does not require any particular technique to be used for fabricating the initial structure shown in FIG. 1. In the preferred embodiment, substrate 10 has a resistivity of 5 ohm-cm, buried layer 12 has an impurity concentration of $10^{19}$ atoms of antimony per cubic centimeter, while epitaxial layer 15 is about 1 micron thick and has a resistivity of 0.4 ohm-cm.

Figure 2:
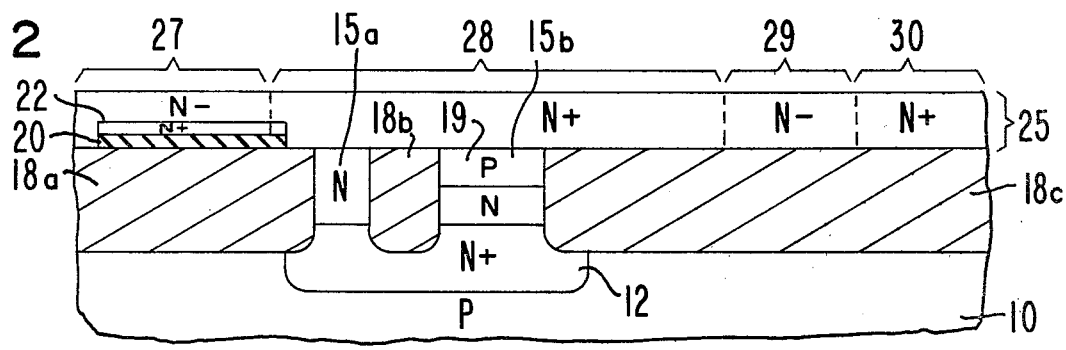

Next, as shown in FIG. 2, a layer of metal silicide 20 approximately 1000 angstroms thick is deposited on the upper surface of insulating region 18a. Typically metal silicide layer 20 comprises tungsten silicide, however, other metal silicides may also be used. Refractory metal silicides have been found particularly advantageous for fabricating layer 20 because of their resistance to the high temperatures used in subsequent process steps depicted in FIGS. 3 through 5. On the upper surface of tungsten silicide layer 20 a layer of heavily doped N conductivity type polycrystalline silicon 22 is deposited. Polycrystalline silicon layer 22 is typically 1000 angstroms thick and is deposited contiguously on the upper surface of metal silicide 20. Metal silicide layer 20 may be deposited using known chemical vapor deposition technology, as may layer 22. In the preferred embodiment, arsenic is used to dope polycrystalline silicon 22 to an impurity concentration of $10^{20}$ atoms per cubic centimeter.

As shown in FIG. 2, using well-known integrated circuit fabrication technology, a mask is formed across the upper surface of silicon dioxide 18 and epitaxial material 15. An opening in the mask is made over the epitaxial region 15b and P conductivity type impurity is implanted to create region 19 having a substantially uniform P conductivity type impurity concentration of $10^{17}$ atoms per cubic centimeter. As will be seen in conjunction with FIGS. 4 and 5, region 19 functions as the base of a bipolar transistor fabricated between oxide isolation regions 18b and 18c. In the preferred embodiment, region 19 is fabricated using ion implantation with a dose of $10^{12}$ atoms per square centimeter and an implant energy of 100 kev.

Next, and as also shown in FIG. 2, a relatively thicker layer of polycrystalline silicon 25 is deposited across the upper surface of lightly doped polycrystalline silicon 22, epitaxial silicon 15, and silicon dioxide 18. Layer 25 may be deposited using chemical vapor deposition, and in the preferred embodiment will comprise polycrystalline silicon lightly doped with phosphorous to an impurity concentration of $10^{17}$ atoms per cubic centimeter. Following the formation of layer 25, and using well-known integrated circuit fabrication techniques, selected portions 28 and 30 of layer 25 may be more heavily doped with N conductivity type impurities, for example, phosphorous or arsenic. In the preferred embodiment polycrystalline silicon 25 is doped with arsenic in regions 28 and 30 using ion implantation to achieve an impurity concentration of $10^{20}$ atoms per cubic centimeter. A substantially uniform impurity concentration may be accomplished using an implant energy of 200 kev and a dose of $10^{16}$ atoms per square centimeter. As will be discussed, the regions 27 and 29 of polycrystalline silicon 25 which are not more heavily doped will be used for making Schottky barrier diodes and a polycrystalline silicon resistors, with the diodes formed in region 27 and a resistor in region 29.

Figure 3:
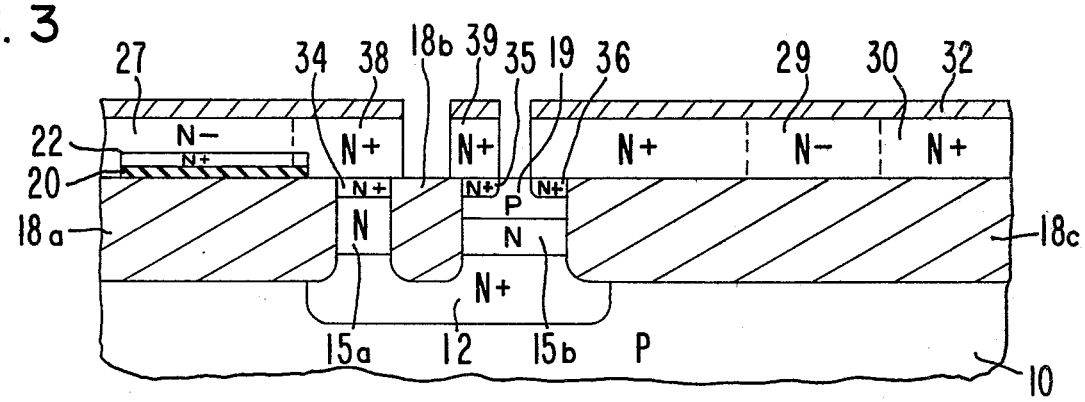

The next process operations are depicted in FIG. 3. A silicon dioxide layer 32 is formed across the upper surface of layer 25. In the preferred embodiment, layer 32 is formed by heating the structure shown in FIG. 2 to a temperature of 800° C. for 30 minutes to create a layer of silicon dioxide 1000 angstroms thick.

Using well-known integrated circuit fabrication technology, layer 32 is photolithographically patterned and it and underlying layers are selectively removed to create an opening to base 19 and to create an isolated region of doped silicon 39. Polycrystalline silicon 25 may be removed using an anisotropic silicon etching process with a parallel plate plasma etcher.

Figure 4:
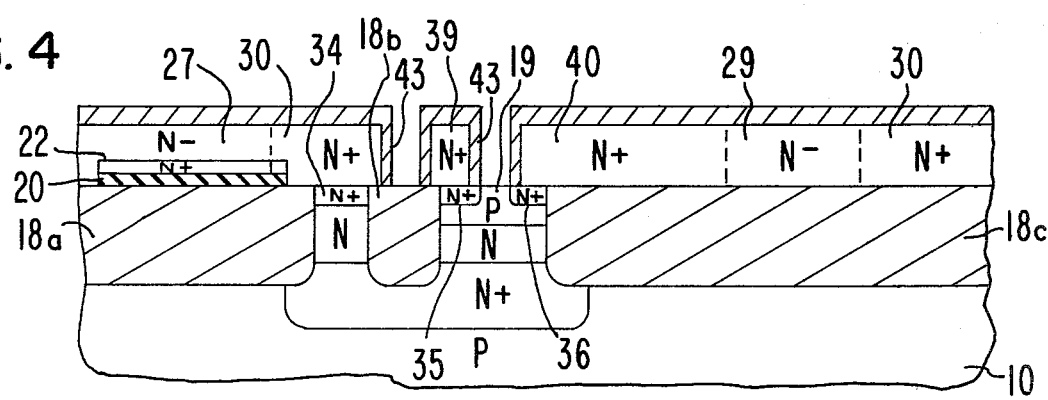

As shown in FIG. 4 a thin layer of silicon dioxide 43 is formed on the side walls of polycrystalline silicon regions 38, 39 and 40. This layer may be formed by heating the structure shown in FIG. 3 to a temperature of 1000° C. for 60 minutes in an atmosphere containing oxygen. The resulting silicon dioxide on the side walls will be approximately 1000 angstroms thick. The heat used to form silicon dioxide 32 will cause some of the N conductivity type impurities present in regions 38, 39 and 40 of layer 25 to diffuse out of layer 25 into the surface of epitaxial silicon 15. This outdiffusion will create N+ conductivity type regions 34, 35 and 36. Region 34 serves as a connection between region 15a in the epitaxial layer and the N+ conductivity type region 38 in polycrystalline silicon 25. Regions 35 and 36 form N conductivity type emitters for the bipolar transistor of which region 19 functions as the base and region 15b as the collector.

Although not shown in FIG. 4, at the same time silicon dioxide 43 forms on the side walls, it will also form on the exposed portions of the silicon region 19. Additionally, oxide isolation region 18b may expand upward slightly. An opening through the silicon dioxide 43 forming on silicon 19 is made using an anisotropic etching process. In the preferred embodiment this is accomplished using commercially available plasma etching equipment and an etch gas of $CF_4$. An anisotropic process is used to avoid etching through the side wall oxide 43 on polycrystalline silicon regions 39 and 40. This side wall oxidation serves to prevent a subsequently formed electrical contact from short circuiting any of regions 35, 36, and 19 together.

Figure 5:
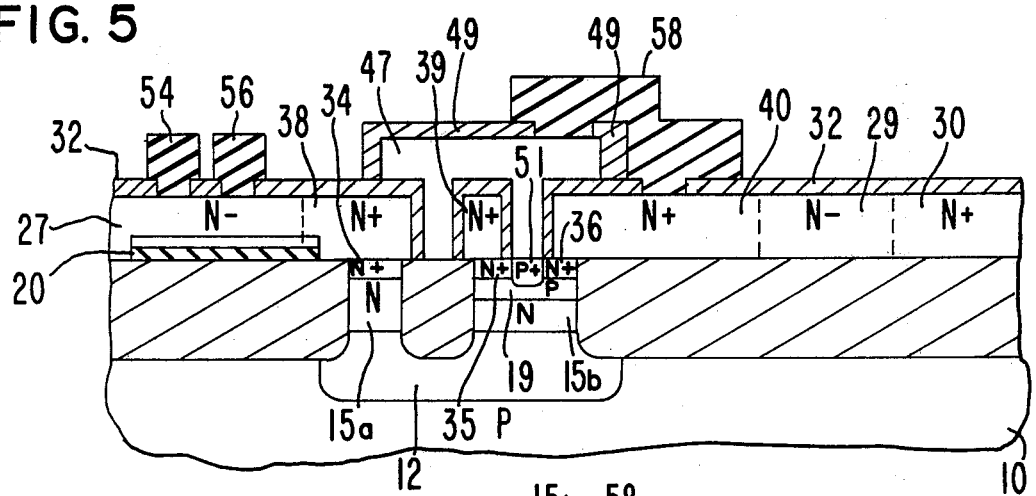

As next shown in FIG. 5, a further layer of polycrystalline silicon 47 is deposited across the surface of the structure and patterned using well-known integrated circuit fabrication technology to create the regions shown. Polycrystalline silicon 47 is subsequently doped by ion implantation with a P conductivity type impurity, for example, boron, to an impurity concentration of $10^{19}$ atoms per cubic centimeter. After patterning using well known techniques, polycrystalline silicon is oxidized to create silicon dioxide layer 49. This may be achieved by heating the structure to a temperature of 1000° C. for a period of 60 minutes to create a layer of oxide 49 approximately 3000 angstroms thick. As a result of this thermal process, P conductivity type impurities in the polycrystalline silicon 47 will diffuse out of the polycrystalline silicon 47 and into region 19 to thereby form a base contact region 51. Region 51 electrically connects silicon 47 to base region 19.

Using well-known integrated circuit technology, openings are created in silicon dioxide layer 49 and in silicon dioxide layer 32. This may be achieved using photolithographic masking techniques. A layer of metal, typically aluminum, is then deposited and patterned using well-known techniques to create electrical contacts 54, 56 and 58. The interface between metal 54 and lightly doped N conductivity type polycrystalline silicon 27 forms a Schottky barrier diode, as does the interface between metal 56 and layer 27. These Schottky barrier diodes are electrically connected to the collector 15b of a vertical NPN bipolar transistor by virtue of the tungsten silicide layer 20, the heavily doped polycrystalline silicon 38, the collector sink 15a, and buried layer 12.

The vertical NPN bipolar transistor includes a base region 19, a first emitter 35 and a second emitter 36 in addition to collector 15b. N conductivity type region 39 provides an ohmic connection to emitter 35, while region 40 connects to emitter 36. Emitter 36 is shorted to the base of the vertical transistor by the metal 58 connection between base contact 47 and emitter contact 40. As previously explained, lightly doped N type silicon 29 serves as a resistor connected to the shorted emitter-base of the transistor.

Figure 6:
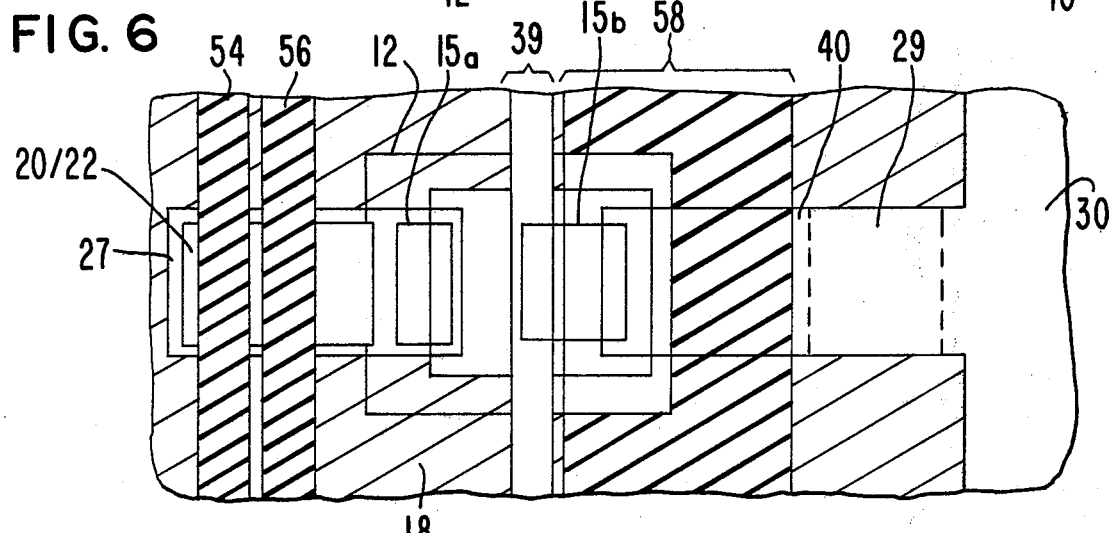

FIG. 6 is a top view of the structure shown in FIG. 5. Corresponding components are given the same numerical designation. Interconnections between the particular logic structure shown in FIG. 5 and other logic structures formed on the same substrate 10 extend in parallel as shown in FIG. 6. These connections include Schottky diode connections 54 and 56, a grounded bipolar emitter connection 39, the emitter "tie back" and base contact 58, and a power supply line 30.

Figure 7:
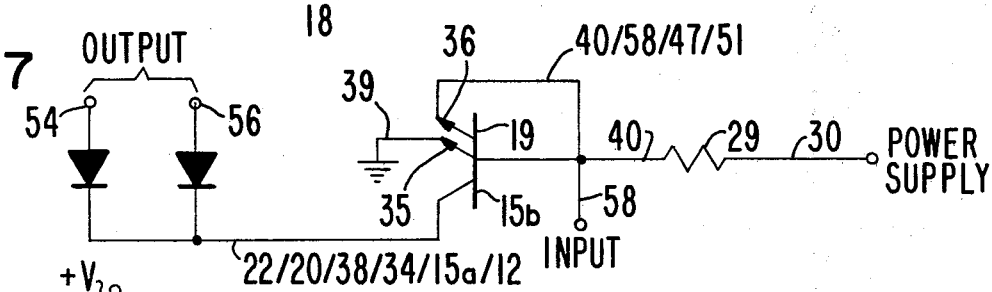
FIG. 7 is an electrical schematic of the circuit depicted in FIGS. 5 and 6.

FIG. 7 is a schematic of the integrated circuit shown in FIGS. 5 and 6. Corresponding portions of the schematic have been given the same reference numerals as the structure shown in FIGS. 5 and 6.

Figure 8:
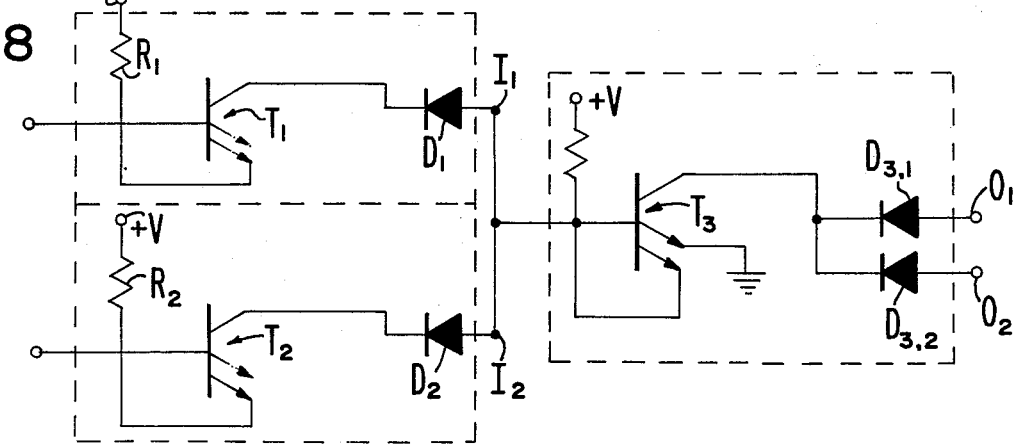
FIG. 8 is an electrical schematic of a group of interconnected logic structures each of which is fabricated according to this invention.

The operation of the integrated circuit logic structure depicted schematically in FIG. 7 may be understood in conjunction with FIG. 8. FIG. 8 shows five logic structures connected to operate as a NAND gate with nodes $I_1$ and $I_2$ as inputs and nodes $O_1$ and $O_2$ as outputs. Logical "0" and "1" are defined by 0.4 volts and 0.8 volts, respectively at input and output nodes.

If nodes $I_1$ and $I_2$ are at 0.4 volts each because transistors $T_1$ and $T_2$ are on, then transistor $T_3$ will be off. If transistor $T_1$ is off and transistor $T_2$ is on, or vice versa, nodes $I_1$, and $I_2$ will still be at 0.4 volts because whichever transistor is on will sink current through resistor $R_1$ via diode $D_2$ thereby holding transistor $T_3$ off.

If both transistors $T_1$ and $T_2$ are off the current through resistor $R_1$ will force transistor $T_1$ on causing the potential node $O_1$ to drop to 0.4 volts, the logical "0" state. As evident, no current may flow through nodes $I_1$ and $I_2$ to turn transistor $T_3$ on.

The invention described above allows the fabrication of an unusually compact logic gate. With one micron layout rules, a bipolar transistor occupying only nine square microns may be fabricated which permits very high density layouts and high-speed operations. Fabrication of the Schottky diodes on the field oxide eliminates cathode to substrate capacitance and reduces the diode series resistance by several orders of magnitude over prior art structures. Fabrication of the resistor on the field oxide also substantially reduces resistor to substrate capacitance.

Although the invention has been described with reference to a preferred embodiment, the description is intended to be illustrative of the invention and not to be construed as limiting the invention. Various modifications and applications will occur to those skilled in the art without departing from the spirit and scope of the invention as defined by the appended claims.

What is claimed is:

1. A process for fabricating an integrated circuit comprising:
   fabricating a pocket of semiconductor material surrounded by insulating material;
   depositing a layer of a metal silicide on a first region of the insulating material;
   depositing a first layer of semiconductor material on the layer of metal silicide; and
   forming selected portions of a second layer of semiconductor material over at least a second region of the insulating material, the first layer of semiconductor material, and selected portions of the pocket, at least those portions of the second layer extending from the first layer to the pocket and from the pocket to the second region having higher impurity doping than that portion of the second layer overlying the second region.

2. A process as in claim 1 wherein:
   the insulating material comprises oxidized silicon; and
   the first and the second layers of semiconductor material comprise silicon.

3. A process as in claim 2 wherein the first and the second layers comprise polycrystalline silicon.

4. A process as in claim 1 wherein the step of forming selected portions of a second layer comprises:
   depositing lightly doped semiconductor material;
   doping those portions of the second layer which have a higher impurity doping; and
   removing undesired regions of the second layer.

5. A process as in claim 4 wherein the second layer is deposited over all of the pocket and the insulating material and then removed from over part of the pocket.

6. A process as in claim 1 further including the step of fabricating at least one transistor in the pocket.

7. A process as in claim 6 wherein a third region of the second layer is separated from the pocket by the second region of the second layer.

8. A process as in claim 7 further including the step of fabricating electrical connections of the third region, the at least one transistor, and the first layer of semiconductor material.

9. A process as in claim 1 wherein the first layer of semiconductor material is more heavily doped than the portion of the second layer overlying the second region.

* * * * *

UNITED STATES PATENT OFFICE
CERTIFICATE OF CORRECTION

PATENT NO. : 4,418,468
DATED : December 6, 1983
INVENTOR(S) : Madhukar B. Vora and Hemraj K. Hingarh It is certified that error appears in the above-identified patent and that said Letters Patent are hereby corrected as shown below:

Cover page, item [73], change "Hermaj" to --Hemraj--.

Signed and Sealed this

Twelfth Day of March 1985

[SEAL]

Attest:

DONALD J. QUIGG

*Attesting Officer*    *Acting Commissioner of Patents and Trademarks*